United States Patent [19]
Kojima

[11] Patent Number: 5,262,987
[45] Date of Patent: Nov. 16, 1993

[54] FLOATING GATE SEMICONDUCTOR NONVOLATILE MEMORY HAVING IMPURITY DOPED REGIONS FOR LOW VOLTAGE OPERATION

[75] Inventor: Yoshikazu Kojima, Tokyo, Japan
[73] Assignee: Seiko Instruments Inc., Japan
[21] Appl. No.: 917,804
[22] Filed: Jul. 20, 1992

Related U.S. Application Data
[63] Continuation of Ser. No. 438,713, Nov. 17, 1989, abandoned.

Foreign Application Priority Data
Nov. 17, 1988 [JP] Japan .................. 63-290547
Jul. 20, 1989 [JP] Japan .................. 1-188069
Jul. 21, 1989 [JP] Japan .................. 1-190185

[51] Int. Cl.$^5$ ............... G11C 16/04; H01L 29/788
[52] U.S. Cl. ............... 365/185; 365/178; 365/184; 257/316; 257/326; 257/315
[58] Field of Search .......... 365/104, 178, 184, 185; 357/23.5; 257/314, 315, 316, 326

[56] References Cited
U.S. PATENT DOCUMENTS
| | | | |
|---|---|---|---|
| 4,267,558 | 5/1981 | Guterman | 257/320 |
| 4,403,307 | 9/1983 | Maeda | 257/316 |
| 4,622,656 | 11/1986 | Kamiya et al. | 365/185 |
| 4,949,140 | 8/1990 | Tam | 257/316 |
| 4,958,321 | 9/1990 | Chang | 365/218 |
| 5,014,097 | 5/1991 | Kazerounian et al. | 257/317 |

FOREIGN PATENT DOCUMENTS
| | | | |
|---|---|---|---|
| 0106079 | 12/1980 | Japan . | |
| 0182777 | 9/1985 | Japan . | |
| 0169070 | 7/1988 | Japan | 365/185 |
| 2200795 | 8/1988 | United Kingdom . | |

OTHER PUBLICATIONS
Wada et al, "Limiting Factors for Programming EPROM of Reduced Dimensions," Int'l. Electron Devices Meeting (IEDM), Digest of Tech. Papers, 1980, pp. 38-41.

Primary Examiner—Glenn Gossage
Attorney, Agent, or Firm—Bruce L. Adams; Van C. Wilks

[57] ABSTRACT

A semiconductor nonvolatile memory has a base semiconductor region of one conductivity type. A first semiconductor region of the one conductivity type is formed in a surface portion of the base semiconductor region and has an impurity density higher than that of the base semiconductor region. A source region and a drain region of opposite conductivity than the first semiconductor region are formed in a surface portion of the first semiconductor region in spaced relation from each other. A second semiconductor region of the one conductivity type is formed in a surface portion of the first semiconductor region and contains an impurity of the opposite conductivity type. A floating gate electrode is formed over and electrically insulated from the second semiconductor region, and a control gate electrode is formed over and electrically insulated from the floating gate electrode. The control gate may include a section which is formed over a portion of a channel region between the source and drain regions, and a third semiconductor region may be formed below this section of the control gate. The semiconductor nonvolatile memory has a lowered threshold voltage and is operative at low drive voltages and at high speed while maintaining high programming performance and memory cell separation or isolation.

9 Claims, 3 Drawing Sheets

Depth from substrate surface

FLOATING GATE SEMICONDUCTOR NONVOLATILE MEMORY HAVING IMPURITY DOPED REGIONS FOR LOW VOLTAGE OPERATION

This is a continuation application of parent application Ser. No. 07/438,713 filed Nov. 17, 1989, now abandoned.

BACKGROUND OF THE INVENTION

The present invention relates to a semiconductor nonvolatile memory of the floating gate type used in electronic instruments, such as computers, and which is erasable by irradiation with ultraviolet rays.

Conventionally, as shown in FIG. 2, a semiconductor nonvolatile memory cell of the floating gate type erasable by ultraviolet rays is constructed such that a source region 2 of N+ type and a drain region 3 of N+ type are formed in a surface of a P type semiconductor substrate 1, and a floating gate electrode 5 is formed over a channel region between the source region 2 and the drain region 3 on the semiconductor substrate surface, the floating gate electrode 5 being covered with an electrically insulating film. This type of memory cell is disclosed, for example, in M. Wada et al. "Limiting Factors for Programming EPROM of Reduced Dimensions" in International Electron Devices Meeting (IEDM) Dig. Tech. Papers, pp 38–41 (1980).

However, in the conventional semiconductor nonvolatile memory cell, as shown in FIG. 2, the substrate 1 has formed in the surface thereof an impurity-doped region 8 having an impurity density higher than that of the substrate 1 so as to reduce program time and to separate or isolate memory cells from each other. Therefore, the memory has a high threshold voltage of about 1.5 V after the erasing by ultraviolet light and therefore the memory has a drawback that the operation is difficult in the low voltage range.

SUMMARY OF THE INVENTION

In view of the above noted drawback of the prior art, an object of the present invention is to provide a semiconductor nonvolatile memory cell operative by a low drive voltage at high speed while maintaining the programming performance and the memory cell separation.

According to the present invention, an impurity-doped region of relatively high density is formed to ensure the programming performance and cell separation, and another impurity of opposite conductivity type is formed within the first-mentioned impurity-doped region so as to reduce the threshold voltage after erasing by ultraviolet rays or light to about 0.7 V to thereby realize low operating voltage and high operation speed.

DETAILED DESCRIPTION OF THE PREFERRED EMBODIMENTS

Figure 1:
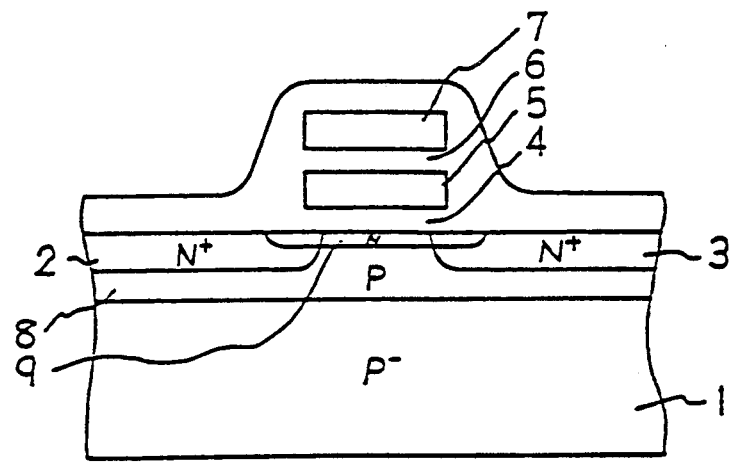
FIG. 1 is a sectional view showing a first embodiment of a semiconductor nonvolatile memory cell according to the present invention, taken along the length direction of a channel region of the memory cell.
Figure 2:
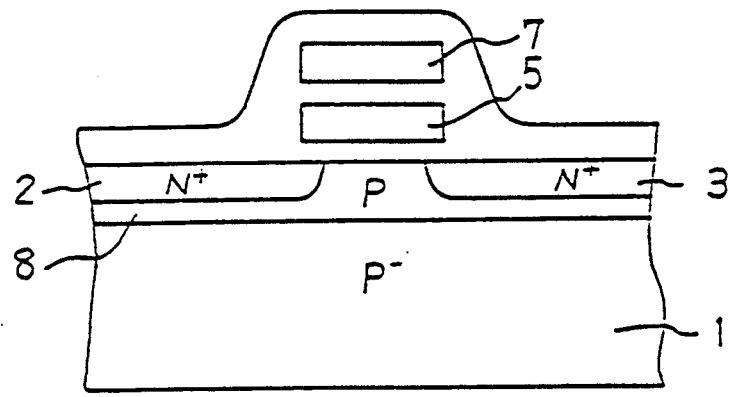
FIG. 2 is a sectional view of a conventional semiconductor nonvolatile memory cell.

Hereinafter, embodiments of the present invention will be described in conjunction with the drawings. The description will be given for an ultraviolet-ray-erasable semiconductor nonvolatile memory of N type. FIG. 1 shows a section of a first embodiment of the present invention. The memory cell is comprised of a P type silicon substrate 1 which has formed in a surface thereof an impurity-doped region 8 having an impurity density higher than that of the substrate 1. Further, an N type impurity is doped at a relatively low density in a region 9 inside the impurity-doped region 8. A floating gate electrode 5 is formed over the impurity-doped regions 8 and 9 through a gate oxide film 4, and further a control gate electrode 7 is formed over the floating gate electrode 5 through a control gate insulating film 6. A source region 2 and a drain region 3 of N+ type are formed in spaced relation in the substrate surface under the floating gate electrode 5. In this construction, the control gate electrode 7 is strongly capacitively coupled to the floating gate electrode 5 through the control gate insulating film 6. In operation, control gate electrode 7 is applied with a voltage to indirectly control the electric potential of the floating gate electrode 5.

Firstly, description will be given for the reading operation of the FIG. 1 semiconductor nonvolatile memory cell of the floating gate type. While a given constant voltage is applied to the control gate electrode 7, impedance is detected in a channel region defined between the source region 2 and the drain region 3 in the surface of the semiconductor substrate 1 so as to read out information. Namely, when the floating gate electrode 5 is injected with a great number of electrons, the impedance is high in the channel region. On the other hand, when the floating gate electrode 5 is not injected with electrons such as after erasing by ultraviolet rays, the impedance is low. Consequently, the impedance changes depending on whether the floating gate electrode 5 is injected with electrons or not to indicate the information. Namely, the information is memorized in the form of electrons stored in the floating gate electrode 5, and therefore is not volatile during the normal operation and in the storage state. When changing or rewriting the information, ultraviolet rays are irradiated to discharge the electrons 5 to the substrate from the floating gate electrode 5 (hereinafter, referred to as "ultraviolet-ray-erasing"). Thereafter, according to information to be written or programmed, a voltage is applied to each electrode to inject electrons into the floating gate electrode 5 to thereby carry out "programming".

Detailed description is given below for the method of injecting electrons into the floating gate electrode 5, i.e., the method of programming. The source region 2 is held at the same potential as the substrate 1, the drain region 3 is applied with a voltage of 4-10 V and the control gate electrode 7 is applied with a high voltage of 7-14 V. Consequently, a channel current flows between the source and drain regions, and a part of the channel current converts into hot electrons and is injected into the floating gate electrode 5. With regard to a memory cell not to be injected, either of the drain region 3 or the control gate electrode 7 is held at the same potential as the substrate to avoid injection, The P type impurity-doped region 8 having high impurity density is formed in the surface of the substrate 1 to facilitate the generation of hot electrons to improve the programming performance.

Figure 3:
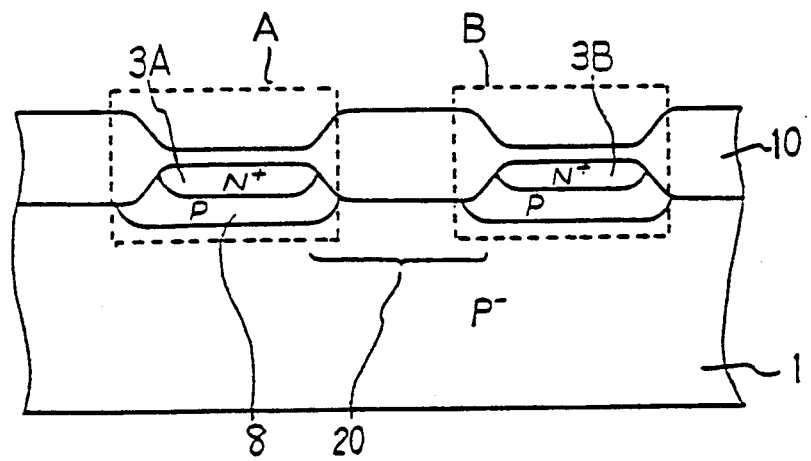
FIG. 3 is another sectional view of the first embodiment taken along the width direction of the channel region of the semiconductor nonvolatile memory cell, showing adjacent drain regions of the memory cell array.

FIG. 3 is a sectional view of the inventive semiconductor nonvolatile memory, taken along the width direction of the channel region. A plurality of memory cells are arranged in an array and individual memory cells are necessarily separated from each other. Namely, as shown in FIG. 3, a drain region 3A of a memory cell A is electrically separated or isolated from an adjacent drain region 3B of another memory cell B by a separating region 20 composed of a field oxide film 10. The separation region is needed to withstand a high voltage which would be applied to a control gate electrode 7 and a drain region 3 when injecting electrons into a floating gate electrode 5. For example, when applying a voltage of about 12.5 V to the control gate electrode 7 to effect the injection of electrons, the separating region 20 must be formed to withstand the voltage of 12.5 V. In the present invention, as shown in FIG. 3, the substrate 1 is formed with the high density P type region 8, which is the same type as the substrate, by of self-alignment doping in the active area (which is the area other than the separating region). Stated otherwise, the doping is carried out over the substrate surface using the separation region 20 as a mask to form the high-density region 8 so that the separating region 20 is also doped to increase its threshold voltage to ensure the separating characteristic. When using a voltage of about 12.5 V for the programming, the doping must be carried out with an ion implantation amount more than $2 \times 10^{12}$ atoms/cm$^3$ for the high density region 8. Increase of this doping amount can concurrently improve the separation characteristic.

According to the present invention, the semiconductor nonvolatile memory is constructed in order to enable low voltage operation such that a dopant of N type is diffused within the impurity-doped region 8 to form therein another impurity-doped region 9, rather than simply reducing the density of the impurity-doped region 8 which would hinder the separation characteristic. The region 9 is effective to reduce the surface net impurity density over the channel region to thereby set its threshold voltage to about 0.7 V after the irradiation with ultraviolet rays. The introduction of this N type dopant can be carried out in the same step of forming the P type high impurity-doped region 8. Namely, without adding a photolithography step, N type and P type dopants can be doped into the active area through double-ion-implantation. However, in order to form the region 9 within or inside the region 8, the N type dopant must be composed of elements having a diffusion coefficient smaller than that of the P type dopant. For example, the N type dopant may be composed of arsenic and the P type dopant may be composed of boron such that, as shown in FIG. 1, the thin impurity-doped region 9 of low net density is formed inside the thick impurity-doped region 8 of high density.

As described above, while the additional region 9 is formed to lower the threshold voltage of the channel region, the separation can be sufficiently maintained among the individual cells as shown in FIG. 3. Namely, the P type impurity-doped region 8 having high doping density is sufficiently overlapped with the field oxide film 10. More specifically, boron is doped to form the region 8 at an ion implantation amount greater than $2 \times 10^{12}$ atoms/cm$^3$ to ensure the electrical separation, and arsenic is doped at an ion implantation amount less than that of the boron to form the region 9 to improve the programming performance while maintaining the memory cell separation to realize a memory operative in a low voltage range. Ion implantations of boron and arsenic can be carried out sequentially in the same photolithographic step, thereby avoiding increased costs due to the addition of another photolithographic step. Further, doping of the N type and P type dopants can be efficiently carried out by self-alignment using the separating region 20 as a mask, resulting in improvement of the separating feature.

Figure 4:
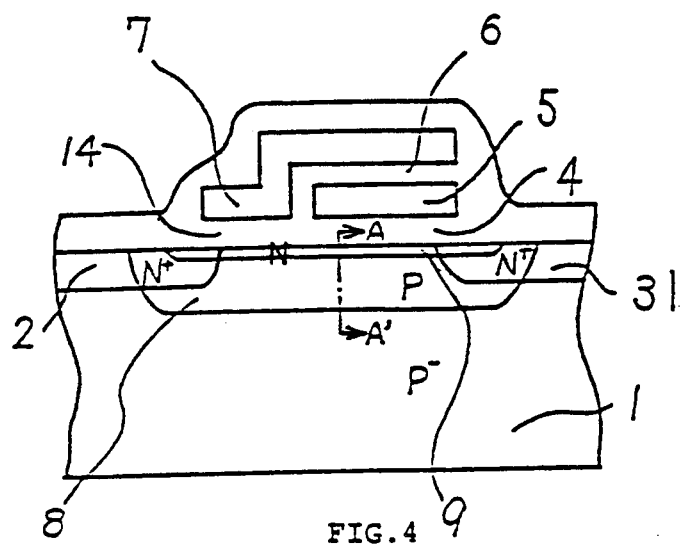
FIG. 4 is a sectional view showing a second embodiment of a semiconductor nonvolatile memory cell according to the present invention.
Figure 5:
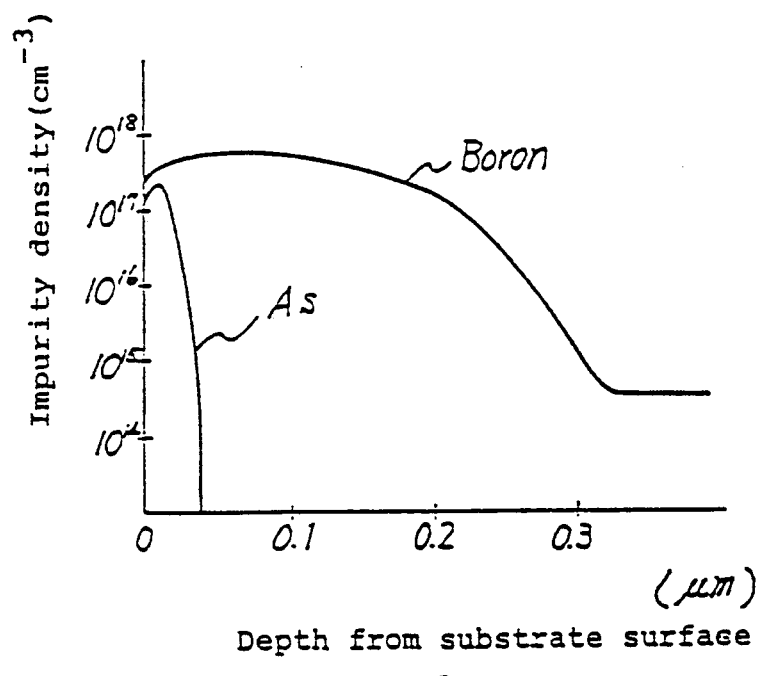
FIG. 5 is a diagram showing the impurity distribution of the channel region along depth line A—A' of the FIG. 4 semiconductor nonvolatile memory cell.

FIG. 4 is a sectional view showing a second embodiment of the inventive semiconductor nonvolatile memory cell. The gate structure of the inventive semiconductor nonvolatile memory cell is formed not only in the silicon substrate, but also in a semiconductor region formed in the substrate as well as on a surface of a semiconductor film. In FIG. 4, the memory cell is comprised of a P type silicon substrate 1 which has formed over a surface thereof a floating gate electrode 5 through a first gate insulating film 4. A control gate electrode 7 is formed over the floating gate electrode 5 through an interlayer insulating film 6 and over the substrate through a second gate insulating film 14, and a source region 2 and drain region 3 of N+ type are formed in a surface of the substrate 1 through self-alignment using the floating gate electrode 5 and the control gate electrode 7 as a mask. Further, a first impurity-doped region 8 of P type having an impurity density higher than that of the substrate 1 is formed between the source region 2 and the drain region 3 in the surface of the substrate 1 to define therebetween a channel region, and a second impurity-doped region 9 containing both an N type impurity as well as a P type impurity is formed in the surface of the first impurity-doped P type region 8. Generally, the surface density of the P type impurity is set higher than that of the N type impurity so that the second impurity-doped region 9 is still of electrically more P type. Namely, the region 9 contains more of the P type impurity than the N type impurity in spite of additional doping of the N type impurity. The first and second impurity-doped regions can be formed by ion implantation. FIG. 5 shows the vertical distribution of the impurity density in the first and second impurity doped regions 8 and 9. Namely, the impurity density distribution is indicated along line A—A′ of FIG. 4 from the surface of the substrate 1, in which boron is used for the dominant impurity of the first impurity-doped region 8 and arsenic is used for the additive impurity of the second impurity-doped region 9. Boron and arsenic may be introduced in the same step so that, as shown in FIG. 5, the distribution of arsenic is limited within the boron-doped area because arsenic has a diffusion rate smaller than that of boron. Accordingly, the impurity density of P type is electrically reduced or canceled on the surface of the channel region by addition or distribution of N type arsenic. The first impurity-doped region 8 is effective to satisfy the programming feature of the inventive semiconductor nonvolatile memory in a manner similar to the FIG. 1 embodiment and effective to raise the threshold voltage of the field oxide film between the memory cells to thereby electrically separate the memory cells from each other. Impurity of P type is doped in the surface of the substrate 1 at an amount of approximately $10^{17}$ atoms/cm$^3$ to form the first impurity-doped region 8 to thereby facilitate the generation of hot electrons at the time of programming. The second impurity-doped region 9 is formed to reduce the threshold voltage of the memory. The control gate electrode 7 is strongly capacitively coupled to the floating gate electrode 5. Accordingly, the control gate electrode 7 is applied with a voltage to indirectly change the electric potential of the floating gate electrode 5.

Now a description will be given for the reading method cell of the FIG. 4 semiconductor nonvolatile memory. A plurality of memory cells are integrated in the form of a memory array, in which individual memory cells are selected to read therefrom information. In the selected memory cell, while the control gate electrode 7 thereof receives a voltage equal to or close to the power supply voltage level, the current is detected in the channel region between the source region 2 and the drain region 3 to thereby read out the information. Namely, the channel conductance is large in the state after irradiation with erasing ultraviolet rays. On the other hand, the channel conductance is small in the programmed state in which many electrons are injected into the floating gate electrode 5. The channel region is composed of a first channel region controlled by the control gate electrode 7 through the second gate insulating film 14 and a second channel region connected in series to the first channel region and controlled by the potential of the floating gate electrode 5 through the first gate insulating film 4. Namely, the channel conductance is determined by the conductance values of the first and second channel regions. The conductance of the second channel region changes according to the amount of electrons injected into the floating gate electrode 5, while the control gate electrode 7 is applied with a constant voltage. Therefore, the channel conductance is accordingly changed between the source region 2 and the drain region 3 to indicate the information according to the changing amount of electrons injected.

In the FIG. 4 semiconductor nonvolatile memory of the second embodiment according to the present invention, the entire channel region is composed of the first channel region controlled directly by the voltage of the control gate electrode, and the second channel region connected in series to the first channel region and controlled by the potential level of the floating gate electrode 5. Accordingly, the second channel region can be formed so that its threshold voltage after ultraviolet-ray-erasing is set sufficiently low, while the first channel region is formed sot hat its threshold voltage is set to the enhancement level so that leak current can be sufficiently reduced in a nonselected memory cell. Further, when the drain region 3 is applied with a voltage during the reading operation, the potential level of the floating gate electrode 5 may be raised to thereby increase the channel conductance of the second channel region. In view of this, the first channel region can be formed to set its channel conductance to a low level so as to avoid off-leak current of the nonselected memory cell. Moreover, in the second embodiment of the inventive semiconductor nonvolatile memory cell, the drain region 3 is connected to ground and the source region 2 is applied with a power source voltage through a load to read the information in terms of the value of the channel conductance, thereby realizing a more functional memory. Namely, the floating gate electrode 5 is not structurally connected to the source region 2, thereby eliminating an inadvertent writing during the normal reading operation (soft-write). Consequently, the entire length of the channel region can be reduced as compared to the conventional memory cell, and the source region 2 can receive a high voltage close to the power supply voltage during the reading operation. Consequently, the channel conductance can have a large value after the ultraviolet-ray erasing of the memory to realize high speed reading operation.

Next, a description will be given for the programming method of the second embodiment of the invention. When injecting electrons into the floating gate electrode 5 of the memory cell, the drain region 3 is applied with a voltage of about 4–7 V with respect to the source region 2 and the substrate 1. Further, the control gate electrode 7 is applied with a high voltage of about 12 V. The application of the voltages to the drain region 3 and to the control gate electrode 7 causes a large channel current in the order of 1 mA to flow through the channel region, thereby generating hot electrons in the vicinity of the drain region 3. A part thereof is injected into the floating gate electrode 5. A nonselected memory cell does not receive a voltage at its control gate electrode 7 so that writing is not effected. Further, the selected memory cells may include those which do not need injection of electrons into the floating gate electrode 5. In such memory cells, while the control gate electrode 7 is supplied with a high voltage, the drain region 3 is connected to ground to thereby avoid writing. Namely, only when both the drain region 3 and the control gate electrode 7 are applied with voltages, can electrons be injected into the floating gate electrode 5. The FIG. 4 memory cell has a structure effective to suppress the soft-write phenomenon so that the channel length can be set short. Accordingly, the writing operation can be carried out in an extremely short period of time. Further, in a nonselected memory cell during the writing operation, while the drain region 3 may be applied with a high voltage, the control gate electrode 7 is connected to ground so that the conductance of the first channel region is sufficiently small, thereby preventing off-leak current from the nonselected memory cell.

The second impurity-doped regions is formed by doping of arsenic in the surface the channel region so as to lower the threshold voltage. This impurity-doped region 9 does not impair the programming efficiency of the memory. The surface potential is induced during the writing operation in the vicinity of the drain region 3 to generate the hot electrons. This surface potential is not affected by the doping of arsenic. The reason is that the second impurity-doped region 9 doped with arsenic is formed in only an extremely thin surface portion of the channel region due to the small diffusion rate of arsenic as shown in FIG. 5.

In order to reduce the threshold voltage of the channel region, the density of the first impurity-doped region 8 could be reduced instead of forming the second impurity-doped region 9. However, in such case, the surface potential effective to generate the hot electrons is limited, thereby hindering the efficiency of programming. According to the present invention, on the other hand, the second impurity-doped region 9 is formed to maintain the programming efficiency of the memory and simultaneously reduce the threshold voltage of the memory cell.

Figure 6:
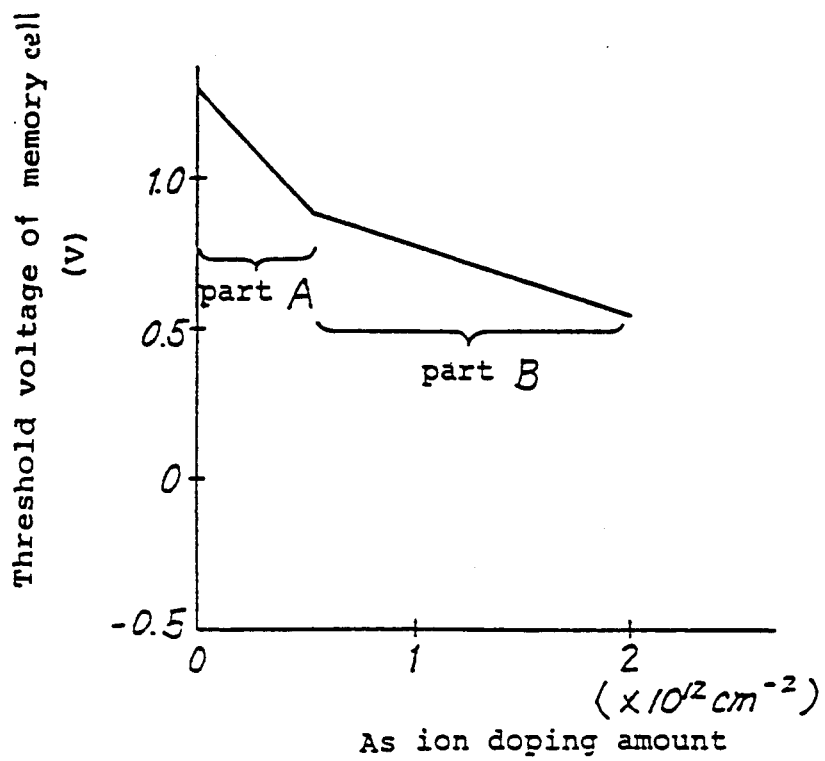
FIG. 6 is a diagram illustrating the dependency of threshold voltage of the semiconductor nonvolatile memory cell of the second embodiment on arsenic ion doping rate.

Next, a description will be given for the erasing method of the FIG. 4 embodiment. The erasing is carried out by irradiating ultraviolet rays onto the memory. The electrons injected into the floating gate electrode 5 are excited by the ultraviolet rays so as return to the substrate 1 to thereby effect erasing. FIG. 6 shows the dependency of the threshold voltage of the memory after the ultraviolet ray irradiation on the doping amount of arsenic (As). As indicated by FIG. 6, the dependency on the doping of arsenic is characterized by two parts divided by the critical doping amount of $5 \times 10^{11}$. Namely, the threshold voltage has a significantly reducing rate in the part A and has a moderately reducing rate in the part B. The effective threshold voltage of the memory cell of the second embodiment is determined by the greater threshold value of the first and second channel region. If the second impurity-doped region 9 of arsenic were not formed, i.e., the ion implantation amount of arsenic were zero, the threshold voltage after the ultraviolet-ray-erasing is determined by the higher threshold voltage of the second channel region. When the doping amount of arsenic is increased into the second impurity-doped region 9, the magnitudes of the respective threshold voltages of the first and second channel regions are reversed such that the threshold voltage of the first channel region becomes higher than that of the second channel region. Namely, by increasing the doping amount of arsenic, the effective threshold voltage of the memory is shifted from the part A to the part B of FIG. 6. The part A corresponds to the threshold voltage of the second channel region, and the part B corresponds to the threshold voltage of the first channel region. In the part B, in order to reduce the dependency of the threshold voltage of the first channel region on the doping amount of arsenic, the capacity per unit area of the second gate insulating film 14 is set greater than that of the first gate insulating film 4. The capacity per unit area of the gate insulating film can be increased to reduce the contribution of the doping amount of arsenic to the threshold voltage. In order to reduce the threshold voltage of the memory, the density of the first impurity-doped region 8 could be reduced instead of forming the second impurity-doped region 9. However, in such method, the threshold voltage of the first channel region is lower than that of the second channel region. The reason is that the control gate electrode 7 is normally capacitively coupled tot he floating gate electrode 5 by about only 70%, not 100%. On the other hand, in the second embodiment of the inventive memory cell, the second impurity-doped region 9 is formed so that the threshold voltage of the first channel region is made higher than that of the second channel region. Such adjustment of the threshold voltages can be carried out by changing the impurity density.

Figure 7:
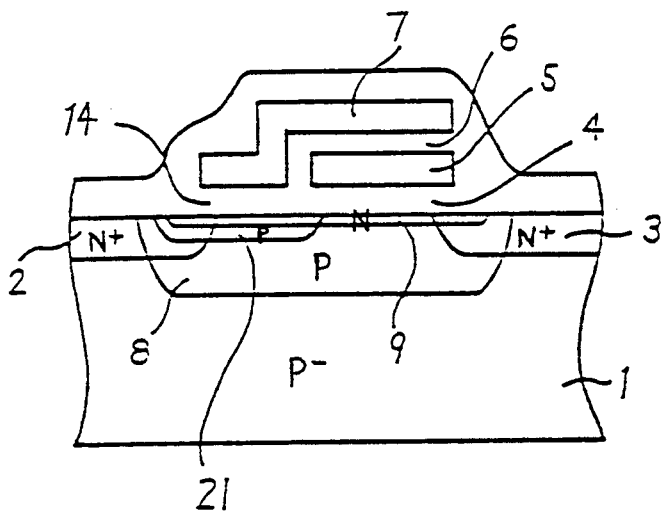
FIG. 7 is a sectional view showing a third embodiment of inventive semiconductor nonvolatile memory cell.

FIG. 7 is a sectional view showing a third embodiment of the inventive semiconductor nonvolatile memory. A third impurity doped region 21 of P type is formed in the first channel region by self-alignment using the floating gate electrode 5 as a mask. Impurity of P type is doped to cancel the impurity of N type in the second impurity-doped region 9 so as to set high the threshold voltage of the first channel region. In the FIG. 4 semiconductor nonvolatile memory cell, the second gate insulating film 14 can be formed of a thermal oxidation film after removing the first gate insulating film such that a part of the second impurity-doped region 9 is integrated into the second gate insulating film 14 to thereby reduce the arsenic density of the first channel region. Accordingly, the threshold voltage of the first channel region is made higher than that of the second channel region.

In the second and third embodiments, arsenic is doped to reduce the threshold voltage after the ultraviolet-ray-erasing to about 0.5 V. This threshold voltage of the memory is the threshold voltage of the first channel region and therefore is stable independently of voltage applied to the drain region 2 to thereby reduce off-leak current. Since the threshold voltage can be reduced to about 0.5 V, a power source voltage of at least about 1.0 V can be used to drive the memory. Further, by reducing the threshold voltage, drain current can be increased to enable high speed operation.

As described above, the inventive semiconductor nonvolatile memory of the floating gate type erasable by ultraviolet rays contains dopant of the same conductivity type as that of the substrate, doped into the semiconductor surface through self-alignment process using the separating region as a mask, and another dopant of less diffusable type doped at lower density than that of the first-mentioned dopant. In this manner, the threshold voltage can be lowered to the range of 0.5–1.0 V to thereby effectively facilitate the low voltage and high speed driving while satisfying the programming performance and the separation feature.

What is claimed is:

1. A semiconductor nonvolatile memory comprising:
a base semiconductor region of one conductivity type;
a first semiconductor region of said one conductivity type formed in a surface portion of the base semiconductor region and having an impurity density higher than that of the base semiconductor region;
a source region and a drain region of opposite conductivity than that of the first semiconductor region and formed in a surface portion of the first semiconductor region in spaced relation from each other;
a second semiconductor region of said one conductivity type containing both an impurity of said opposite conductivity type and an impurity of said one conductivity type, the second semiconductor region being formed in a surface portion of the first semiconductor region and extending from the source region to the drain region;
a floating gate electrode formed over and electrically insulated from the second semiconductor region; and
a control gate electrode formed over and electrically insulated from the floating gate electrode.

2. A semiconductor nonvolatile memory, according to claim 1, wherein the control gate electrode includes a section capacitively coupled to the floating gate electrode to indirectly control a channel region defined between the source and drain regions.

3. A semiconductor nonvolatile memory according to claim 2, wherein the control gate electrode includes another section formed over and electrically insulated from a part of the channel region to directly control said part of the channel region.

4. A semiconductor nonvolatile memory according to claim 3, further including a third semiconductor region of said one conductivity type containing an extra impurity of said one conductivity type and formed in a surface portion of the first semiconductor region under said another section int he second semiconductor region.

5. A semiconductor nonvolatile memory comprising:
a semiconductor substrate of a first conductivity type;
a first semiconductor region of said first conductivity type formed in a surface portion of the semiconductor substrate and having an impurity density higher than that of the semiconductor substrate;
a source region and a drain region of a second conductivity type formed in spaced relation in a surface portion of the first semiconductor region to define therebetween a channel region;
a second semiconductor region of said first conductivity type containing both an impurity of said second conductivity type and an impurity of said first conductivity type, the second semiconductor region being formed in a surface portion of the first semiconductor region and extending from the source region to the drain region;
a floating gate electrode formed over and electrically insulated from the second semiconductor region; and
a control gate electrode formed over and electrically insulated from the floating gate electrode, wherein the control gate electrode has a prolonged portion disposed over and electrically insulated from a part of the second semiconductor region to define a first channel region in the second semiconductor region under the prolonged portion and a second channel region under the floating gate electrode, a threshold voltage of the first channel region being higher than that of the second channel region.

6. A semiconductor nonvolatile memory according to claim 5, wherein the first channel region is adjacent to the source region.

7. A semiconductor nonvolatile memory according to claim 5, wherein the first channel region is adjacent to the drain region.

8. A semiconductor nonvolatile memory according to claim 5, further including a third semiconductor region formed in a surface portion of the first semiconductor region under the prolonged portion of the control gate and containing an impurity of said first conductivity type, the third semiconductor region having a higher impurity density than that of the second semiconductor region.

9. A semiconductor nonvolatile memory comprising:
a base semiconductor region of one conductivity type;
a first semiconductor region of said one conductivity type formed in a surface portion of the base semiconductor region and having an impurity density higher than that of the base semiconductor region;
a source region and a drain region of opposite conductivity than that of the first semiconductor region and formed in a surface portion of the first semiconductor region in spaced relation from each other;
a second semiconductor region formed in a surface portion of the first semiconductor region between the source and drain regions and containing an impurity of said opposite conductivity type;
a floating gate electrode formed over and electrically insulated from the second semiconductor region;
a control gate electrode formed over and electrically insulated from the floating gate electrode, the control gate electrode having a section capacitively coupled to the floating gate electrode to indirectly control a channel region defined between the source and drain regions, and another section formed over and electrically insulated from a part of the channel region to directly control said part of the channel region; and
a third semiconductor region formed under said another section and containing an impurity of said one conductivity type, the third semiconductor region having a higher impurity density than that of the second semiconductor region.

* * * * *